United States Patent
Kim (10) Patent No.: US 10,985,781 B2
(45) Date of Patent: *Apr. 20, 2021

(54) ERROR CORRECTION CIRCUIT, OPERATING METHOD THEREOF AND DATA STORAGE DEVICE INCLUDING THE SAME

(71) Applicant: SK hynix Inc., Gyeonggi-do (KR)

(72) Inventor: Jang Seob Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 13 days.

This patent is subject to a terminal disclaimer.

(21) Appl. No.: 16/506,766

(22) Filed: Jul. 9, 2019

(65) Prior Publication Data

US 2019/0334557 A1  Oct. 31, 2019

Related U.S. Application Data

(63) Continuation of application No. 15/845,574, filed on Dec. 18, 2017, now Pat. No. 10,374,638.

(30) Foreign Application Priority Data

Sep. 15, 2017  (KR) .......................... 10-2017-0118563

(51) Int. Cl.
*G06F 11/00* (2006.01)
*H03M 13/29* (2006.01)
*H03M 13/15* (2006.01)
*H04N 19/65* (2014.01)

(52) U.S. Cl.
CPC ..... *H03M 13/2975* (2013.01); *H03M 13/152* (2013.01); *H03M 13/2948* (2013.01); *H03M 13/2963* (2013.01); *H04N 19/65* (2014.11)

(58) Field of Classification Search
CPC .......... H03M 13/2975; H03M 13/152; H03M 13/2948; H03M 13/2963; H04N 19/65; H04N 19/61; G11C 29/02
USPC ............... 714/701, 704, 709, 746, 799, 819; 365/200, 201, 189.011, 189.15, 189.16
See application file for complete search history.

(56) References Cited

U.S. PATENT DOCUMENTS

| 5,313,425 A | * | 5/1994 | Lee | G11C 29/88 365/201 |
| 2003/0145274 A1 | * | 7/2003 | Hwang | G11B 20/1833 714/799 |
| 2004/0114454 A1 | * | 6/2004 | Farmwald | G11C 11/4076 365/198 |

* cited by examiner

*Primary Examiner* — Christine T. Tu
(74) *Attorney, Agent, or Firm* — IP&T Group LLP (57) ABSTRACT

An error correction circuit includes a control unit suitable for receiving a data chunk including a plurality of data blocks, each of the data blocks being included in a corresponding codeword of a first direction and a corresponding codeword of a second direction; and a decoder suitable for performing a decoding operation on a codeword, which is selected by the control unit, in the data chunk, wherein the control unit calculates a first reference value by applying a correction capability value of the first direction to a flag of the first direction, calculates a second reference value by applying a correction capability value of the second direction to a flag of the second direction, selects a priority direction from the first direction and the second direction based on the first reference value and the second reference value, and preferentially selects codewords of the priority direction for decoding operations.

20 Claims, 6 Drawing Sheets

: Data block

ERROR CORRECTION CIRCUIT, OPERATING METHOD THEREOF AND DATA STORAGE DEVICE INCLUDING THE SAME

CROSS-REFERENCES TO RELATED APPLICATION

This application is a continuation of U.S. patent application Ser. No. 15/845,574 filed on Dec. 18, 2017, which claims benefits of priority of Korean Patent Application No. 10-2017-0118563 filed on Sep. 15, 2017. The disclosure of each of the foregoing application is incorporated herein by reference in its entirety.

BACKGROUND

1. Technical Field

Various exemplary embodiments generally relate to an error correction circuit. Particularly, exemplary embodiments of the present disclosure relate to an error correction circuit that is applied to a data storage device.

2. Related Art

A data storage device may store data provided from an external device, in response to a write request from the external device. Also, the data storage device may provide stored data to the external device, in response to a read request from the external device. The external device may be an electronic device capable of processing data such as a computer, a digital camera, or a mobile phone. The data storage device may operate in the external device, or may operate by being manufactured separately and being coupled to the external device.

A data storage device may include an error correction circuit (ECC). In response to a write request from an external device, the error correction circuit may perform an encoding operation on data transmitted from the external device, and the data storage device may store the data added with parity data through the encoding operation. In response to a read request from the external device, the error correction circuit may correct errors in stored data by performing a decoding operation on the stored data, and the data storage device may transmit the error-corrected data to the external device.

The error correction capability of the error correction circuit and quick completion of an error correction operation may be directly connected with the data reliability and operational performance of the data storage device.

SUMMARY

Exemplary embodiments may provide an error correction circuit capable of improving the error correction capability while minimizing a time required for an error correction operation, and an operating method thereof.

Exemplary embodiments may also provide a data storage device including the above-mentioned error correction circuit.

In an embodiment, an error correction circuit may include: a control unit suitable for receiving a data chunk including a plurality of data blocks, each of the data blocks being included in a corresponding codeword of a first direction and a corresponding codeword of a second direction; and a decoder suitable for performing a decoding operation on a codeword, which is selected by the control unit, in the data chunk, wherein the control unit calculates a first reference value by applying a correction capability value of the first direction to a flag of the first direction, calculates a second reference value by applying a correction capability value of the second direction to a flag of the second direction, selects a priority direction from the first direction and the second direction based on the first reference value and the second reference value, and preferentially selects codewords of the priority direction for decoding operations.

In an embodiment, a method for operating an error correction circuit may include: receiving a data chunk including a plurality of data blocks, each of the data blocks being included in a corresponding codeword of a first direction and a corresponding codeword of a second direction; calculating a first reference value by applying a correction capability value of the first direction to a flag of the first direction; calculating a second reference value by applying a correction capability value of the second direction to a flag of the second direction; selecting a priority direction from the first direction and the second direction based on the first reference value and the second reference value; and preferentially performing decoding operations on codewords of the priority direction.

In an embodiment, a data storage device may include: a nonvolatile memory device suitable for reading and outputting a data chunk including a plurality of data blocks, each of the data blocks being included in a corresponding codeword of a first direction and a corresponding codeword of a second direction; and an error correction circuit suitable for performing an error correction operation on the data chunk, the error correction circuit including a control unit suitable for calculating a first reference value by applying a correction capability value of the first direction to a flag of the first direction, calculating a second reference value by applying a correction capability value of the second direction to a flag of the second direction, selecting a priority direction from the first direction and the second direction based on the first reference value and the second reference value, and preferentially selecting codewords of the priority direction for decoding operations; and a decoder suitable for performing a decoding operation on a codeword selected by the control unit.

BRIEF DESCRIPTION OF THE DRAWINGS

The above description and other features and advantages of the present invention will become more apparent to those skilled in the art to which the present invention belongs by describing various embodiments thereof with reference to the attached drawings in which.

DETAILED DESCRIPTION

Hereinafter, an error correction circuit, an operating method thereof and a data storage device including the same according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

Figure 1:
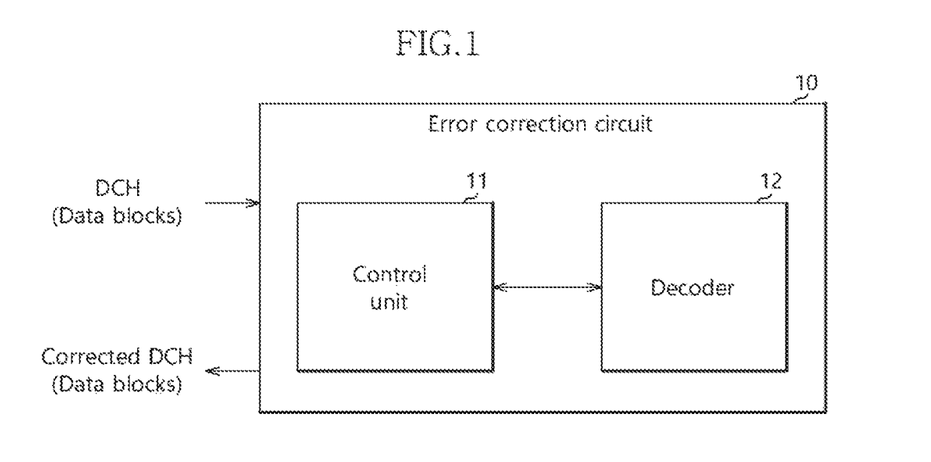
FIG. 1 is a block diagram illustrating an error correction circuit (ECC) in accordance with an embodiment of the present invention.

FIG. 1 is a block diagram illustrating an error correction circuit (ECC) 10 in accordance with an embodiment of the present invention.

Referring to FIG. 1, the error correction circuit 10 may receive a data chunk DCH, perform an error correction operation on the data chunk DCH, and output a corrected data chunk DCH.

The data chunk DCH may be data generated based on a turbo product code (TPC) algorithm. The data chunk DCH may include a plurality of data blocks, and each of the data blocks may be included in a corresponding codeword of a first direction and a corresponding codeword of a second direction. The first direction and the second direction may be a row direction and a column direction or vice versa. Therefore, the data chunk DCH may include codewords of the row direction (hereinafter, referred to as "row codewords"), and codewords of the column direction (hereinafter, referred to as "column codewords"). The structure of the data chunk DCH will be described below in detail with reference to FIG. 2.

The error correction circuit 10 may include a control unit 11 and a decoder 12.

The control unit 11 may select a codeword on which a decoding operation is to be performed, in the data chunk DCH, and may provide the selected codeword to the decoder 12. The control unit 11 may control the decoder 12 to perform the decoding operation on the codeword that has a high possibility of success in the decoding operation.

In detail, the control unit 11 may calculate a flag of the first direction for the data chunk DCH, and may calculate a first reference value by applying a correction capability value of the first direction of the decoder 12 to the flag of the first direction. The control unit 11 may calculate the flag of the first direction by summing up syndrome values of the codewords of the first direction. The control unit 11 may calculate the first reference value by dividing the flag of the first direction by the correction capability value of the first direction.

The control unit 11 may calculate a flag of the second direction for the data chunk DCH, and may calculate a second reference value by applying a correction capability value of the second direction of the decoder 12 to the flag of the second direction. The control unit 11 may calculate the flag of the second direction by summing up syndrome values of the codewords of the second direction. The control unit 11 may calculate the second reference value by dividing the flag of the second direction by the correction capability value of the second direction.

The control unit 11 may select a priority direction from the first direction and the second direction based on the first reference value and the second reference value. The priority direction may be a direction that corresponds to a smaller value between the first reference value and the second reference value. That is, the control unit 11 may select the first direction as the priority direction when the first reference value is smaller than the second reference value. The control unit 11 may select the second direction as the priority direction when the first reference value is equal to or greater than the second reference value.

The control unit 11 may preferentially select the codewords of the priority direction for the decoding operations. Therefore, according to the selection of the control unit 11, the decoder 12 may preferentially perform the decoding operation on each of the codewords of the priority direction.

After selecting the codewords of the priority direction, the control unit 11 may select the codewords of a non-priority direction that is different from the priority direction, for the decoding operations. Thus, after performing the decoding operation on each of the codewords of the priority direction, the decoder 12 may perform the decoding operation on each of the codewords of the non-priority direction.

Meanwhile, the decoding operations on the data chunk DCH may be performed repeatedly. For instance, when the decoding operations have not succeeded on all of the respective codewords included in the data chunk DCH, that is, when there are codewords for which the decoding operations have failed, the decoder 12 may re-perform the decoding operations on the codewords for which the decoding operations have failed. The control unit 11 may increase a repetition count by 1 when the decoding operations have been performed on all of the respective codewords included in the data chunk DCH. The control unit 11 may increase the repetition count by repeating the decoding operations until the repetition count reaches a threshold count. When the repetition count reaches the threshold count, the control unit 11 may terminate the error correction operation on the data chunk DCH, and may output a correction failure result.

Each time the decoding operations on the data chunk DCH are repeated, the control unit 11 may select a new priority direction by calculating a new flag of the first direction and a new flag of the second direction, and may start the decoding operation in the new priority direction.

The decoder 12 may perform the decoding operation on a codeword selected by the control unit 11. The decoder 12 may notify the control unit 11 of whether the decoding operation has succeeded or failed. While the decoder 12 may perform the decoding operation on the codeword based on, for example, a Bose-Chaudhri-Hocquenghem (BCH) algorithm, it is to be noted that the embodiment is not limited thereto.

The decoder 12 may correct errors within a correction capability value that is defined depending on a design. In other words, the decoder 12 may succeed in the decoding operation when the codeword includes errors within the correction capability value, and may fail in the decoding operation when the codeword includes errors exceeding the correction capability value. The decoder 12 may perform the decoding operations on the codeword of the first direction and the codeword of the second direction according to different correction capability values.

In summary, the error correction circuit 10 according to the present embodiment may select a direction where the decoding operation is to be performed in the data chunk DCH, in consideration of the possibility of the decoding operation to succeed. Namely, the error correction circuit 10 may estimate the densities of errors distributed in the data chunk DCH, based on syndrome values and correction capability values, and may start the decoding operation from a direction in which errors are distributed rarely. Therefore, the error correction circuit 10 may quickly terminate the error correction operation on the data chunk DCH. As a result, the error correction capability may be improved while minimizing a time required for the error correction operation.

Figure 2:
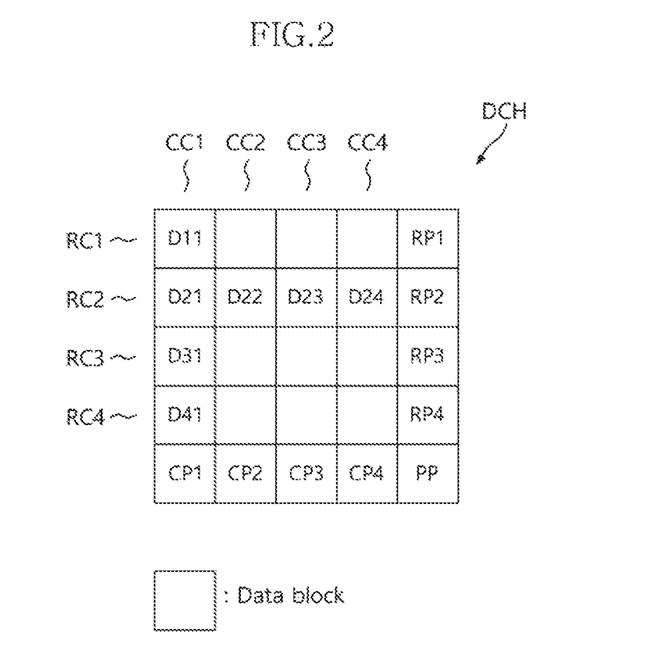
FIG. 2 is a diagram illustrating a data chunk based on a turbo product code (TPC) algorithm.

FIG. 2 is a diagram illustrating the data chunk DCH based on a turbo product code (TPC) algorithm.

Referring to FIG. 2, the data chunk DCH generated based on the TPC algorithm may include a plurality of data blocks. While not shown, each of the data blocks may include a plurality of data bits. The data blocks may be combined to configure row codewords RC1 to RC4 and column codewords CC1 to CC4. A certain data block may be included in a certain row codeword and certain one column codeword at the same time. The codewords of a row direction may mean the row codewords RC1 to RC4, and the codewords of a column direction may mean the column codewords CC1 to CC4. While FIG. 2 illustrates, for ease of description and illustrative purposes, the data chunk DCH which is configured by the four row codewords RC1 to RC4 and the four column codewords CC1 to CC4, it is to be noted that the present disclosure is not limited thereto. That is, the numbers of row codewords and column codewords included in the data chunk DCH may be more or less.

The row codewords RC1 to RC4 may include row parity data blocks RP1 to RP4. Each of the row codewords RC1 to RC4 may include a corresponding one of the row parity data blocks RP1 to RP4, which is generated by encoding corresponding data blocks. For example, the row codeword RC2 may include the row parity data block RP2, which is generated by encoding data blocks D21 to D24. While an encoding operation may be performed based on, for example, a BCH algorithm, to generate each of the row parity data blocks RP1 to RP4, it is to be noted that an encoding operation is not limited thereto in the present embodiment and may be performed based on various ECC algorithms.

The column codewords CC1 to CC4 may include column parity data blocks CP1 to CP4. Each of the column codewords CC1 to CC4 may include a column parity data block which is generated by encoding corresponding data blocks. For example, the column codeword CC1 may include the column parity data block CP1 which is generated by encoding data blocks D11 to D41. While an encoding operation may be performed based on, for example, a BCH algorithm, to generate each of the column parity data blocks CP1 to CP4, it is to be noted that an encoding operation is not limited thereto in the present embodiment and may be performed based on various ECC algorithms.

The data chunk DCH may further include an additional parity data block PP. The additional parity data block PP may be generated by encoding the row parity data blocks RP1 to RP4 and the column parity data blocks CP1 to CP4. The additional parity data block PP may be used to correct an error occurred in the row parity data blocks RP1 to RP4 and the column parity data blocks CP1 to CP4.

The decoder 12 may perform decoding operations on the row codewords RC1 to RC4, based on the row parity data blocks RP1 to RP4. In detail, a decoding operation on each of the row codewords RC1 to RC4 may be performed by correcting errors included in corresponding data blocks, based on a corresponding row parity data block. For example, a decoding operation on the row codeword RC2 may be performed by correcting errors included in the data blocks D21 to D24, based on the row parity data block RP2.

Similarly, the decoder 12 may perform decoding operations on the column codewords CC1 to CC4, based on the column parity data blocks CP1 to CP4. In detail, a decoding operation on each of the column codewords CC1 to CC4 may be performed by correcting errors included in corresponding data blocks, based on a corresponding column parity data block. For example, a decoding operation on the column codeword CC1 may be performed by correcting errors included in the data blocks D11 to D41, based on the column parity data block CP1.

In the data chunk DCH, errors included in the same data block may be corrected through a decoding operation on a corresponding row codeword or a decoding operation on a corresponding column codeword. Therefore, errors included in the same data block may be corrected through a decoding operation on a corresponding column codeword even though they are not corrected through a decoding operation on a corresponding row codeword, or vice versa.

Figure 3:
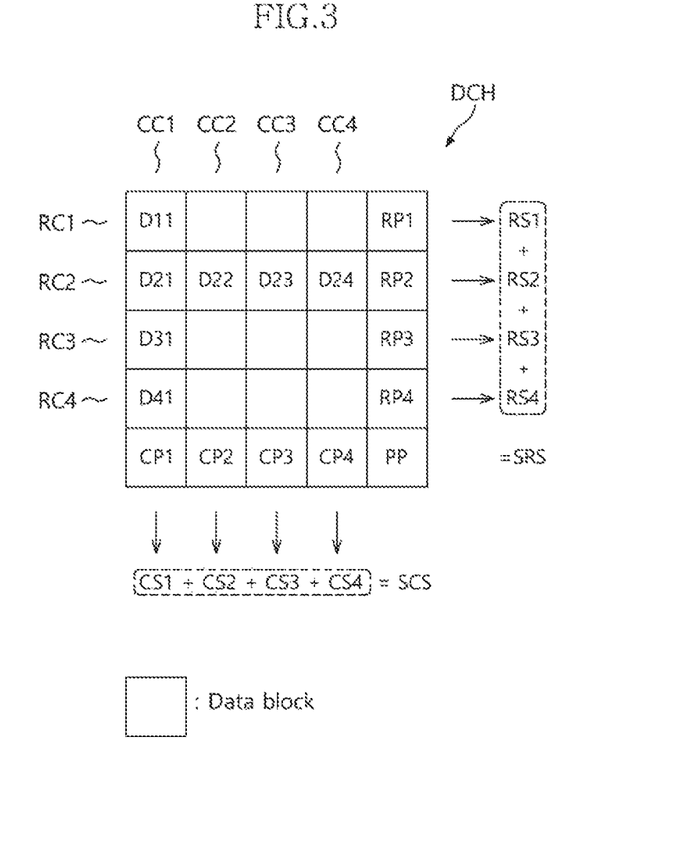
FIG. 3 is a diagram illustrating an operation of a decoder of FIG. 1 to calculate a flag of a row direction and a flag of a column direction and determine a priority direction.

FIG. 3 is a diagram illustrating an operation of the decoder 12 of FIG. 1 to calculate a flag SRS of a row direction and a flag SCS of a column direction and to determine a priority direction.

Referring to FIG. 3, the decoder 12 may calculate row syndromes RS1 to RS4 of row codewords RC1 to RC4 and calculate column syndromes CS1 to CS4 of column codewords CC1 to CC4.

Each of the row syndromes RS1 to RS4 may indicate whether a corresponding row codeword includes at least one error bit. For example, each of the row syndromes RS1 to RS4 may be generated as "1" when a corresponding row codeword includes at least one error bit, and may be generated as "0" when the corresponding row codeword does not include an error bit.

Similarly, each of the column syndromes CS1 to CS4 may indicate whether a corresponding column codeword includes at least one error bit. For example, each of the column syndromes CS1 to CS4 may be generated as "1" when a corresponding column codeword includes at least one error bit, and may be generated as "0" when the corresponding column codeword does not include an error bit.

A method for generating the row syndromes RS1 to RS4 and the column syndromes CS1 to CS4 may be determined according to an ECC algorithm that is used in the encoding operation of the row codewords RC1 to RC4 and the column codewords CC1 to CC4. Since the method is generally known to a person skilled in the art, detailed descriptions thereof will be omitted herein.

The control unit 11 may calculate the flag SRS of the row direction by summing up the row syndromes RS1 to RS4. The control unit 11 may calculate the flag SCS of the column direction by summing up the column syndromes CS1 to CS4.

The control unit 11 may select the priority direction by comparing the flag SRS of the row direction and the flag SCS of the column direction. When the flag SRS of the row direction is smaller than the flag SCS of the column direction, the control unit 11 may select the row direction as the priority direction and select the column direction as a non-priority direction. Then, the control unit 11 may preferentially select the row codewords RC1 to RC4 of the priority direction for decoding operations. After preferentially performing a decoding operation on each of the row codewords RC1 to RC4, the decoder 12 may perform a decoding operation on each of the column codewords CC1 to CC4 of the non-priority direction.

On the contrary, when the flag SRS of the row direction is equal to or greater than the flag SCS of the column direction, the control unit 11 may select the column direction as the priority direction and select the row direction as the non-priority direction. The control unit 11 may preferentially select the column codewords CC1 to CC4 of the priority direction for decoding operations. After preferentially performing a decoding operation on each of the column codewords CC1 to CC4, the decoder 12 may perform a decoding operation on each of the row codewords RC1 to RC4 of the non-priority direction.

Figure 4:
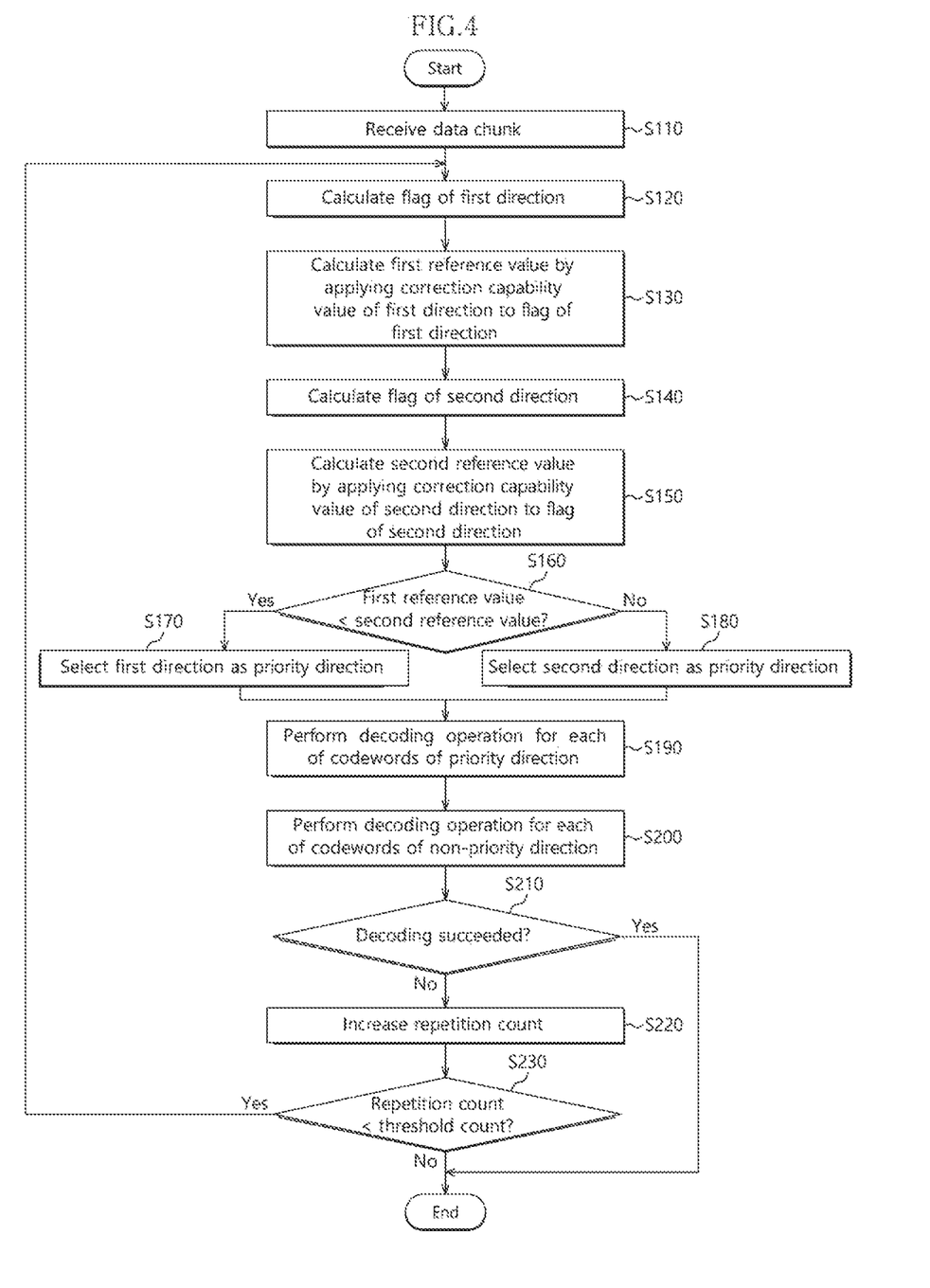
FIG. 4 is a flow chart describing a method of operating an error correction circuit in accordance with an embodiment of the present invention.

FIG. 4 is a flow chart describing a method for operating an error correction circuit 10 in accordance with an embodiment of the present invention.

Referring to FIG. 4, at step S110, the error correction circuit 10 may receive a data chunk DCH. The data chunk DCH may be data generated based on a TPC algorithm.

At step S120, the control unit 11 may calculate a flag of a first direction for the data chunk DCH. In detail, the control unit 11 may calculate the flag of the first direction by summing up the syndrome values of the codewords of the first direction.

At step S130, the control unit 11 may calculate a first reference value by applying a correction capability value of the first direction to the flag of the first direction. In detail, the control unit 11 may calculate the first reference value by dividing the flag of the first direction by the correction capability value of the first direction.

At step S140, the control unit 11 may calculate a flag of a second direction for the data chunk DCH. In detail, the control unit 11 may calculate the flag of the second direction by summing up the syndrome values of the codewords of the second direction.

At step S150, the control unit 11 may calculate a second reference value by applying a correction capability value of the second direction to the flag of the second direction. In detail, the control unit 11 may calculate the second reference value by dividing the flag of the second direction by the correction capability value of the second direction.

At step S160, the control unit 11 may compare the first reference value and the second reference value. When the first reference value is smaller than the second reference value ("Yes" at step S160), the process may proceed to step S170. When the first reference value is equal to or greater than the second reference value ("No" at step S160), the process may proceed to step S180.

At the step S170, the control unit 11 may select the first direction as a priority direction and select the second direction as a non-priority direction.

At the step S180, the control unit 11 may select the second direction as a priority direction select the first direction as a non-priority direction.

At step S190, the decoder 12 may perform a decoding operation on each of the codewords of the priority direction. That is, the control unit 11 may preferentially select the codewords of the priority direction for decoding operations, and may control the decoder 12 to perform a decoding operation on each of the codewords of the priority direction.

At step S200, the decoder 12 may perform a decoding operation on each of the codewords of the non-priority direction that is different from the priority direction. In other words, the control unit 11 may select the codewords of the non-priority direction for decoding operations, and may control the decoder 12 to perform a decoding operation on each of the codewords of the non-priority direction.

At step S210, the control unit 11 may determine whether decoding operations have succeeded on all of the codewords of the data chunk DCH. When the decoding operations have succeeded (that is, "Yes" at step S210), the process may be ended. However, when the decoding operations have not succeeded (that is, "No" at step S210), the process may proceed to step S220.

At the step S220, the control unit 11 may increase a repetition count when the decoding operations have been performed on all of the respective codewords included in the data chunk DCH.

At step S230, the control unit 11 may determine whether the repetition count is less than a threshold count. When the repetition count is equal to or greater than the threshold count ("No" at step S230), the process may be ended. However, when the repetition count is less than the threshold count ("Yes" at step S230), the process may proceed to the step S120. Namely, each time decoding operations on the data chunk DCH are repeated, the control unit 11 may select a new priority direction by calculating a new flag of the first direction and a new flag of the second direction, and may start a decoding operation in the new priority direction.

Meanwhile, in the flow chart of FIG. 4, the proceeding sequence of the steps S120 to S150 is not fixed and may be changed according to various exemplary embodiments.

Figure 5:
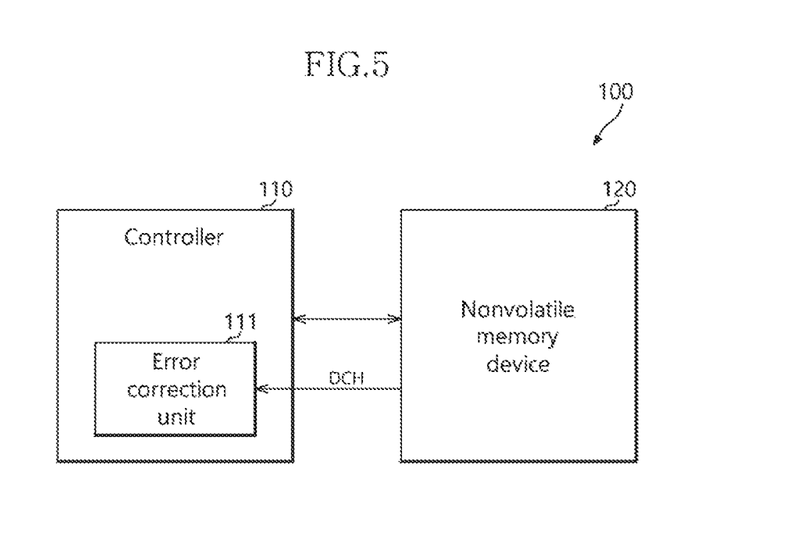
FIG. 5 is a block diagram illustrating a data storage device in accordance with an embodiment of the present invention.

FIG. 5 is a block diagram illustrating a data storage device 100 in accordance with an embodiment of the present invention.

Referring to FIG. 5, the data storage device 100 store data provided from an external device, in response to a write request from the external device. Also, the data storage device 100 may provide the stored data to the external device, in response to a read request from the external device.

The data storage device 100 may be configured by a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD), and the like.

The data storage device 100 may include a controller 110 and a nonvolatile memory device 120.

The controller 110 may control general operations of the data storage device 100. The controller 110 may store data in the nonvolatile memory device 120 in response to the write request, and may read data stored in the nonvolatile memory device 120 and output read data to the external device in response to the read request.

The controller 110 may include an error correction unit 111. The error correction unit 111 may be configured in substantially the same manner as the error correction circuit 10 of FIG. 1. The error correction unit 111 may perform an error correction operation as described above with reference to FIGS. 1 to 4, on a data chunk DCH read from the nonvolatile memory device 120.

The nonvolatile memory device 120 may store the data transmitted from the controller 110 and may read out stored data and transmit the read-out data to the controller 110, according to the control of the controller 110.

The nonvolatile memory device 120 may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

While it is illustrated in FIG. 5 that the data storage device 100 includes one nonvolatile memory device 120, it is to be noted that the number of nonvolatile memory devices included in the data storage device 100 is not limited thereto.

Figure 6:
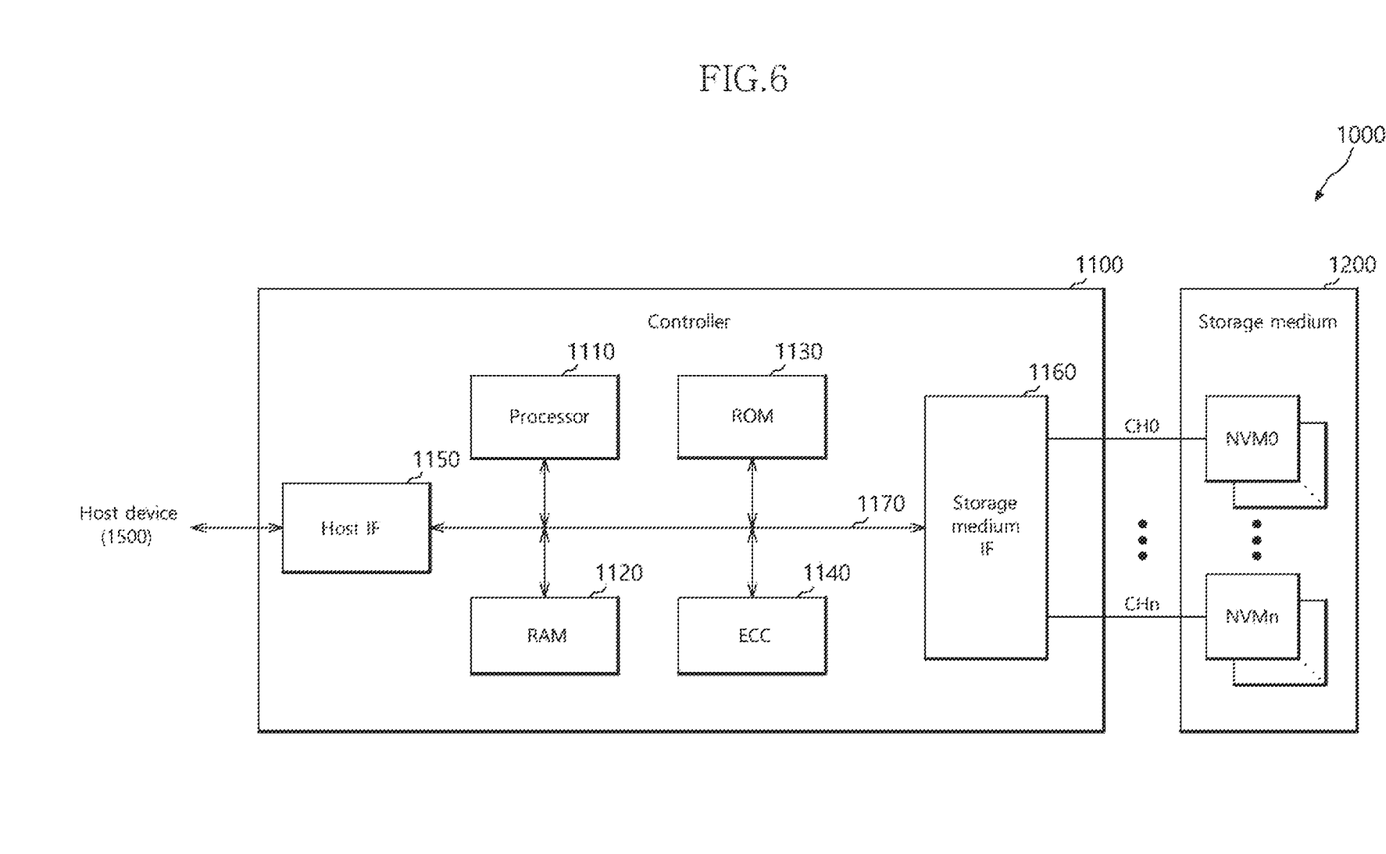
FIG. 6 is a block diagram illustrating a solid state drive (SSD) in accordance with an embodiment of the present invention.

FIG. 6 is a block diagram illustrating a solid state drive (SSD) 1000 in accordance with an embodiment of the present invention.

The SSD 1000 may include a controller 1100 and a storage medium 1200.

The controller 1100 may control data exchange between a host device 1500 and the storage medium 1200. The controller 1100 may include a processor 1110, a random access memory (RAM) 1120, a read only memory (ROM) 1130, an error correction code (ECC) unit 1140, a host interface 1150 and a storage medium interface 1160, which are coupled through an internal bus 1170.

The processor 1110 may control general operations of the controller 1100. The processor 1110 may store data in the storage medium 1200 and read stored data from the storage medium 1200, according to data processing requests from the host device 1500. In order to efficiently manage the storage medium 1200, the processor 1110 may control internal operations of the SSD 1000 such as a merge operation, a wear leveling operation, and so forth.

The RAM 1120 may store programs and program data to be used by the processor 1110. The RAM 1120 may temporarily store data transmitted from the host interface 1150 before transferring it to the storage medium 1200, and may temporarily store data transmitted from the storage medium 1200 before transferring it to the host device 1500.

The ROM 1130 may store program codes to be read by the processor 1110. The program codes may include commands to be processed by the processor 1110, for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm. The ECC unit 1140 may perform an error correction operation as described above with reference to FIGS. 1 to 4, on a data chunk read from a nonvolatile memory device.

The host interface 1150 may exchange data processing requests, data, etc. with the host device 1500.

The storage medium interface 1160 may transmit control signals and data to the storage medium 1200. The storage medium interface 1160 may be transmitted with data from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may perform a write operation and a read operation according to control of the controller 1100.

Figure 7:
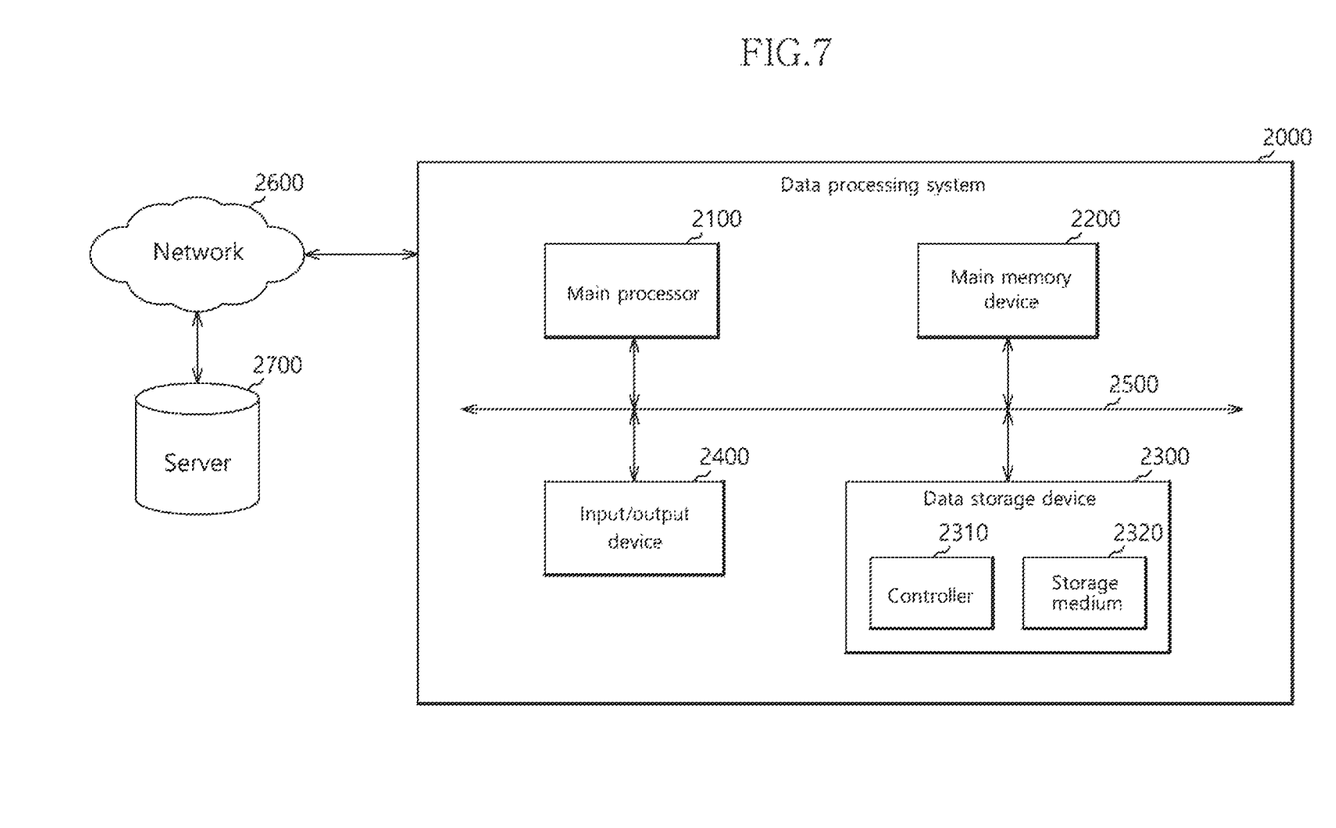
FIG. 7 is a block diagram illustrating a data processing system in accordance with an embodiment of the present invention.

FIG. 7 is a block diagram illustrating a data processing system 2000 to which the data storage device 10 of FIG. 1 is applied, in accordance with an embodiment of the present invention.

The data processing system 2000 may include a computer, a laptop, a netbook, a smart phone, a digital TV, a digital camera, a navigator, etc. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control general operations of the data processing system 2000. The main processor 2100 may be a central processing unit, for example, such as a microprocessor. The main processor 2100 may execute softwares such as an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate substantially similarly to the data storage device 100 of FIG. 5.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a LAN (local area network), a WAN (wide area network), a wireless network, and so on. The data processing system 2000 may include a network interface (not shown) to access the network 2600.

While various embodiments have been described above, it will be understood to those skilled in the art that the embodiments described are examples only. Accordingly, the error correction circuit, the operating method thereof and the data storage device including the same described herein should not be limited based on the described embodiments.

What is claimed is:

1. An error correction circuit comprising:
a control unit suitable for receiving a data chunk including codewords of a first direction and codewords of a second direction; and
a decoder suitable for performing a decoding operation on a codeword, which is selected by the control unit, in the data chunk,
wherein the control unit selects a priority direction from the first direction and the second direction based on a first reference value of the first direction and a second reference value of the second direction, and preferentially selects codewords of the priority direction for decoding operations.

2. The error correction circuit according to claim 1, wherein the priority direction is a direction that corresponds to a smaller value between the first reference value and the second reference value.

3. The error correction circuit according to claim 1, wherein, after selecting the codewords of the priority direction for the decoding operations, the control unit selects codewords of a non-priority direction that is different from the priority direction, for decoding operations.

4. The error correction circuit according to claim 1, wherein the control unit calculates the first reference value by dividing a flag of the first direction by a correction capability value of the first direction, and calculates the second reference value by dividing a flag of the second direction by a correction capability value of the second direction.

5. The error correction circuit according to claim 4, wherein the control unit calculates the flag of the first direction by summing up syndrome values of the codewords of the first direction, and calculates the flag of the second direction by summing up syndrome values of the codewords of the second direction.

6. The error correction circuit according to claim 5, wherein, each time decoding operations on the data chunk are repeated, the control unit selects a new priority direction by calculating a new flag of the first direction and a new flag of the second direction.

7. An error correction circuit comprising:
a control unit suitable for receiving a data chunk including codewords of a first direction and codewords of a second direction, selecting a priority direction from the first direction and the second direction based on a first flag of the first direction and a second flag of the second direction, and selecting a codeword of the priority direction; and
a decoder suitable for performing a decoding operation on the codeword.

8. The error correction circuit according to claim 7, wherein the control unit calculates a first reference value by applying a first correction capability value of the first direction to the first flag, calculates a second reference value by applying a second correction capability value of the second direction to the second flag, selects the priority direction by comparing the first flag and the second flag.

9. The error correction circuit according to claim 8, wherein the control unit calculates the first reference value by dividing the first flag by the first correction capability value, and calculates the second reference value by dividing the second flag by the second correction capability value.

10. The error correction circuit according to claim 9, wherein the priority direction is a direction that corresponds to a smaller value between the first reference value and the second reference value.

11. The error correction circuit according to claim 10, wherein, after selecting codewords of the priority direction for the decoding operations, the control unit selects codewords of a non-priority direction that is different from the priority direction, for decoding operations.

12. The error correction circuit according to claim 7, wherein the control unit calculates the first flag by summing up syndrome values of the codewords of the first direction, and calculates the second flag by summing up syndrome values of the codewords of the second direction.

13. The error correction circuit according to claim 7, wherein, each time decoding operations on the data chunk are repeated, the control unit selects a new priority direction by calculating a new first flag of the first direction and a new second flag of the second direction.

14. A data storage device comprising:
a nonvolatile memory device suitable for reading and outputting a data chunk including codewords of a first direction and codewords of a second direction; and
an error correction circuit suitable for receiving the data chunk from the nonvolatile memory device, selecting a priority direction from the first direction and the second direction based on a first flag of the first direction and a second flag of the second direction, and performing an error correction operation on a codeword of the priority direction.

15. The data storage device according to claim 14, wherein the error correction circuit calculates a first reference value by applying a first correction capability value of the first direction to the first flag, calculates a second reference value by applying a second correction capability value of the second direction to the second flag, selects the priority direction by comparing the first flag and the second flag.

16. The data storage device according to claim 15, wherein the error correction circuit calculates the first reference value by dividing the first flag by the first correction capability value, and calculates the second reference value by dividing the second flag by the second correction capability value.

17. The data storage device according to claim 16, wherein the priority direction is a direction that corresponds to a smaller value between the first reference value and the second reference value.

18. The data storage device according to claim 17, wherein, after selecting codewords of the priority direction for the decoding operations, the error correction circuit selects codewords of a non-priority direction that is different from the priority direction, for decoding operations.

19. The data storage device according to claim 14, wherein the error correction circuit calculates the first flag by summing up syndrome values of the codewords of the first direction, and calculates the second flag by summing up syndrome values of the codewords of the second direction.

20. The data storage device according to claim 14, wherein, each time decoding operations on the data chunk are repeated, the error correction circuit selects a new priority direction by calculating a new first flag of the first direction and a new second flag of the second direction.

* * * * *